United States Patent
Koh et al.

(10) Patent No.: US 7,312,660 B2
(45) Date of Patent: Dec. 25, 2007

(54) DIFFERENTIAL AMPLIFIER AND ACTIVE LOAD FOR THE SAME

(75) Inventors: Jeongwook Koh, Seoul (KR); Han Seung Lee, Ansan-si (KR); Hoon Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 11/396,546

(22) Filed: Apr. 4, 2006

(65) Prior Publication Data

US 2007/0096820 A1    May 3, 2007

(30) Foreign Application Priority Data

Oct. 31, 2005 (KR) ...................... 10-2005-0102785

(51) Int. Cl.
*H03F 3/45* (2006.01)
(52) U.S. Cl. .................. 330/260; 330/258; 330/253
(58) Field of Classification Search ............... 330/260, 330/258, 253
See application file for complete search history.

(56) References Cited

U.S. PATENT DOCUMENTS

| | | | |
|---|---|---|---|
| 4,568,885 A * | 2/1986 | McKenzie et al. | 330/253 |
| 4,958,133 A | 9/1990 | Bazes | |
| 5,331,210 A | 7/1994 | McCarroll | |
| 5,420,539 A * | 5/1995 | Fensch | 330/253 |
| 5,847,607 A * | 12/1998 | Lewicki et al. | 330/258 |
| 6,566,961 B2 | 5/2003 | Dasgupta et al. | |
| 6,750,704 B1 * | 6/2004 | Connell et al. | 330/9 |
| 6,864,728 B1 * | 3/2005 | Lu | 327/122 |
| 7,259,569 B2 * | 8/2007 | Kim | 324/601 |

FOREIGN PATENT DOCUMENTS

| | | |
|---|---|---|
| JP | 05-303436 A | 11/1993 |
| KR | 2003-0092382 A | 12/2003 |
| KR | 2004-0050590 A | 6/2004 |
| KR | 2004-0050591 A | 6/2004 |
| KR | 2004-0051365 A | 6/2004 |

* cited by examiner

*Primary Examiner*—Patricia Nguyen
(74) *Attorney, Agent, or Firm*—Sughrue Mion Pllc.

(57) ABSTRACT

The differential amplifier and an active load are provided. The differential amplifier includes a differential input section which is configured to generate a differential current according to a differential input signal; and an active load which is configured to generate a differential output signal according to the differential current. The active load includes first and second active load sections comprising a first negative feedback loop and a second negative feedback loop, respectively; and a common mode feedback section comprising a feedback current source which supplies a feedback current to the first active load section and the second active load section to form a common mode feedback path.

17 Claims, 6 Drawing Sheets

DIFFERENTIAL AMPLIFIER AND ACTIVE LOAD FOR THE SAME

CROSS-REFERENCE TO RELATED APPLICATION

This application claims priority from Korean Patent Application No. 10-2005-0102785, filed on Oct. 31, 2005, in the Korean Intellectual Property Office, the entire disclosure of which is incorporated herein by reference.

BACKGROUND OF THE INVENTION

1. Field of the Invention

Apparatuses consistent with the present invention relate to a differential amplifier and an active load for the same, and more particularly, to a differential amplifier and an active load providing a common mode feedback.

2. Description of the Related Art

A differential amplifier is one of the most important analog circuits. Most high speed analog circuits are currently embodied by using the differential amplifier. The differential amplifier functions to amplify the difference between two input voltages and generally includes two input terminals.

FIG. 1 is a circuit diagram of a differential amplifier according to the conventional art.

Referring to FIG. 1, the differential amplifier according to the conventional art includes input transistors MN1 and MN2, a current source Iss, load transistors MP1 and MP2, and resistances Rr.

An input signal Vin inputted in a gate of the input transistors MN1 and MN2 is amplified and outputted via an output terminal Vout. In this instance, the transistors MP1 and MP2 function as a load. Resistances Rr provide a common mode feedback to a differential amplifier and stably maintains a common mode bias point of the output terminal Vout. In this instance, a node P may be a virtual ground for a small signal.

The load transistors MP1 and MP2 function as load in the differential amplifier. Generally, when a passive device such as a resistance is not used, but rather an active device such as a transistor is used as a load, the load is an active load.

However, a voltage gain of a differential amplifier illustrated in FIG. 1 is only about $g_{mn}/g_{mp}$. In this instance, $g_{mn}$ is a transconductance of an NMOS transistor and $g_{mp}$ is a transconductance of a PMOS transistor. Also, a pole is positioned in a low frequency because of the resistance Rr, and the frequency characteristic becomes deteriorated. Accordingly, the differential amplifier may not be applicable to an application needing a high frequency gain and a wide bandwidth.

FIG. 2 is a circuit diagram of another differential amplifier according to the conventional art.

Referring to FIG. 2, the differential amplifier according to the conventional art includes input transistors MN1 and MN2, a current source Iss and two active load circuits 210 and 220.

The active load circuits 210 and 220 each include an NMOS transistor, a PMOS transistor, a capacitor and a current source. A bandwidth of the differential amplifier may be increased by using the active load circuits 210 and 220. Moreover, a gain of the differential amplifier may be improved by increasing an output resistance.

However, the differential amplifier illustrated in FIG. 2 has a problem in that the swing of an output is significantly reduced. If the swing of the output voltage is small, an applicable application is severely restricted. This limited output voltage swing may cause a serious malfunction in a low voltage application. Also, in the case of the differential amplifier illustrated in FIG. 2, a transconductance of a transistor varies according to a process variation in fabricating the transistor. A bandwidth and a gain also vary according to the process variation.

Accordingly, compared with the differential amplifier according to the conventional arts illustrated in FIGS. 1 and 2, a new differential amplifier and active load which can provide a higher gain, be used in a wider frequency band, and effectively compensate the change of a common mode operating voltage according to process variation is highly needed.

SUMMARY OF THE INVENTION

The present invention provides a differential amplifier and an active load for the differential amplifier which can provide a feedback current to a negative feedback loop, effectively compensate for the change of a common mode operating voltage generated by process variation and easily set up the common mode operating voltage of a differential amplifier.

The present invention also provides a differential amplifier and active load for the differential amplifier which has improved gain, frequency characteristic, and stability, and which also has an increased output swing and linear operation region.

The present invention also provides a differential amplifier and an active load for the differential amplifier which can insert a resistance into a negative feedback path and reduce the change of a bandwidth or gain of an amplifier according to process variation with respect to the characteristic of a transistor such as a transconductance or the like.

The present invention also provides a differential amplifier and an active load for the differential amplifier which can provide a wider bandwidth and a higher gain even with a low voltage and be effectively applied in an ultra wideband (UWB) applications.

According to an aspect of the present invention, there is provided a differential amplifier including a differential input section which is configured to generate a differential current according to a differential input signal; and an active load which is configured to generate a differential output signal according to the differential current, wherein the active load comprises first and second active load sections comprising a first negative feedback loop and a second negative feedback loop, respectively; and a common mode feedback section comprising a feedback current source which supplies a feedback current to the first active load section and the second active load section to form a common mode feedback path.

The differential amplifier may further include an output buffer which is configured to buffer the differential output signal. The output buffer may be a source follower circuit.

According to another aspect of the present invention, there is provided an active load including a first active load section and a second active load section comprising a first negative feedback loop and a second negative feedback loop, respectively; and a common mode feedback section comprising a feedback current source which supplies a feedback current to the first active load section and the second active load section, and forms a common mode feedback path.

The negative feedback loop may include a pair of transistors. The pair may be an NMOS transistor and PMOS transistor.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS OF THE INVENTION

Figure 1:
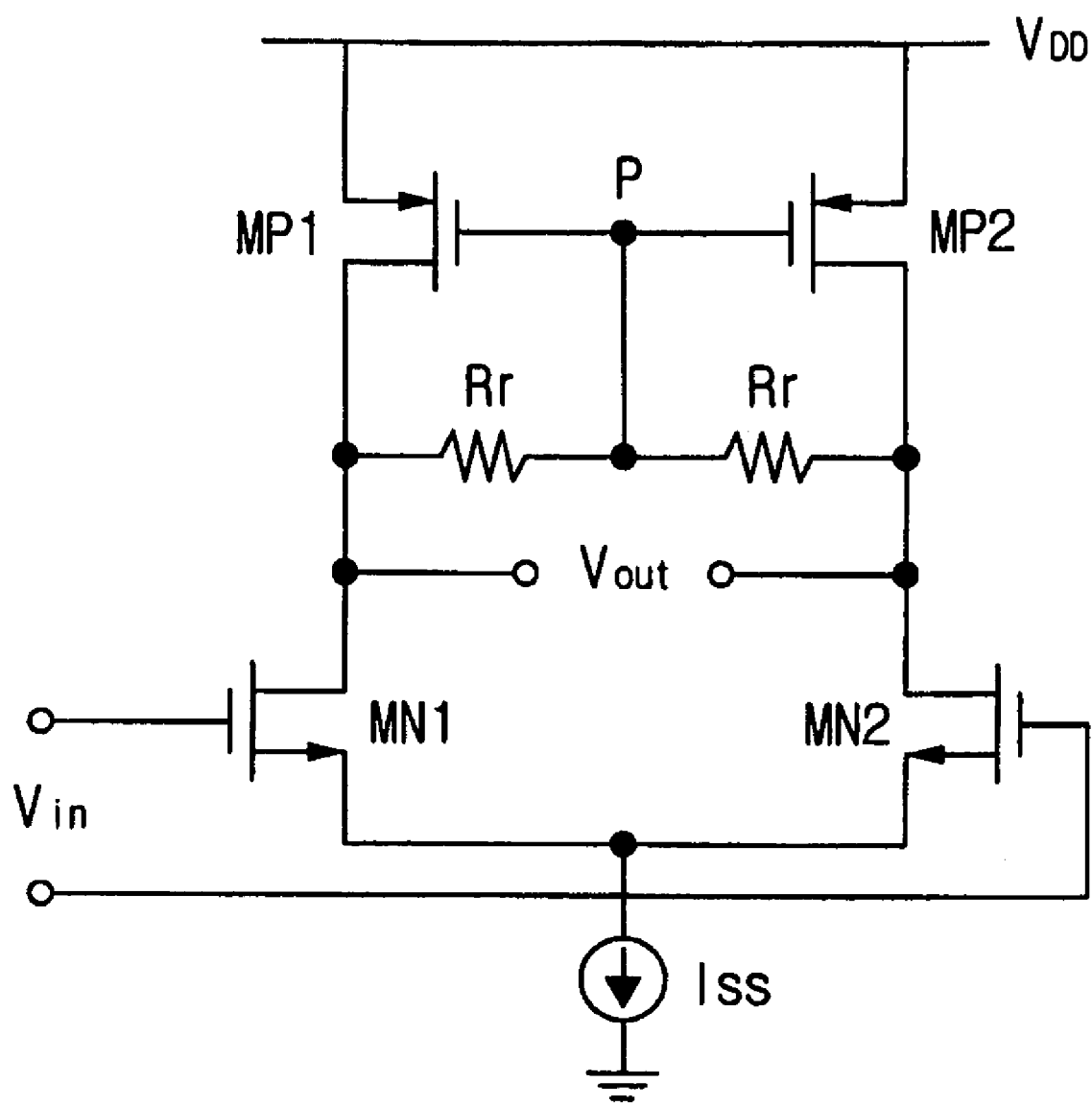
FIG. 1 is a circuit diagram of a differential amplifier according to the conventional art.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
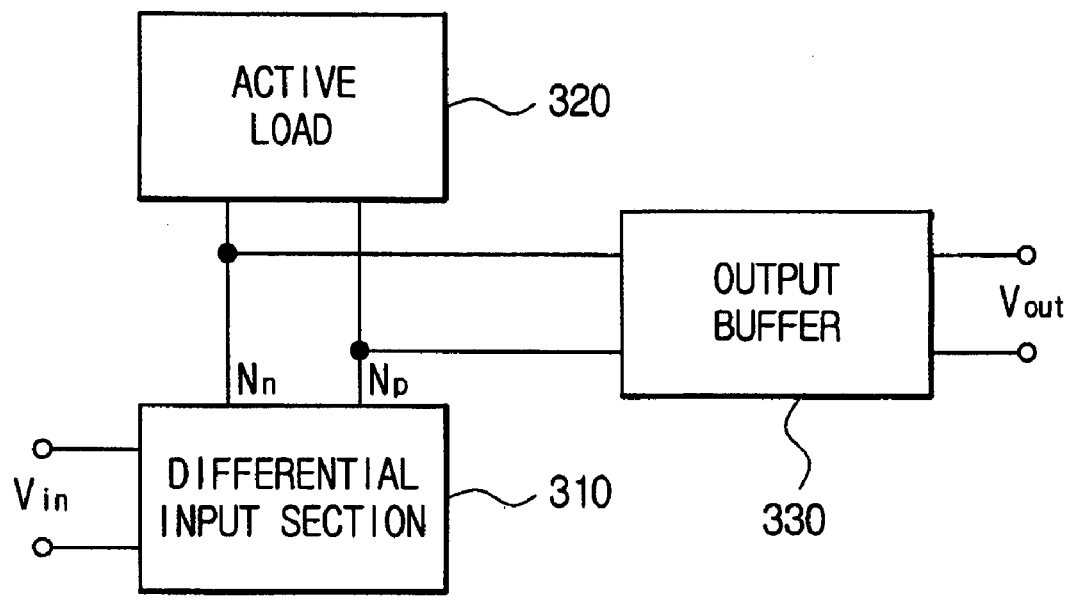
FIG. 3 is a block diagram of a differential amplifier according to an exemplary embodiment of the present invention.

FIG. 3 is a block diagram of a differential amplifier according to an exemplary embodiment of the present invention.

Referring to FIG. 3, the differential amplifier according to an exemplary embodiment of the present invention includes a differential input section 310 and an active load 320. Also, as shown in FIG. 3, the differential amplifier may further include an output buffer 330.

The differential input section 310 generates a differential current according to a differential input signal. The differential input section 310 may be embodied in various types. As an example, the differential input section 310 may use two N-channel metal oxide semiconductor (NMOS) transistors in which each differential input signal is supplied to a gate and each source is connected to a bias current source. Also, the differential input section 310 may use an inverter in which a P-channel metal oxide semiconductor (PMOS) transistor and an NMOS transistor are connected to each other in series.

Figure 4:
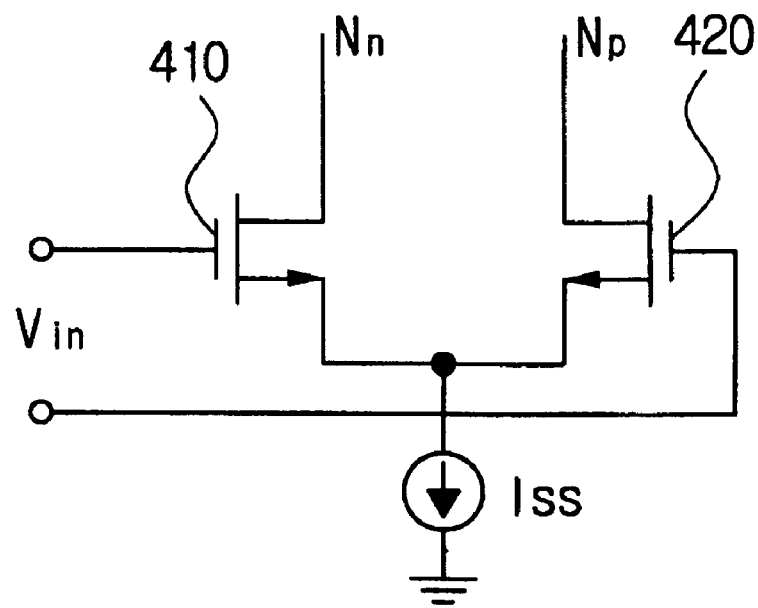
FIG. 4 is a circuit diagram of a differential input section illustrated in FIG. 3 according to an exemplary embodiment of the present invention.

FIG. 4 is a circuit diagram of the differential input section 310 illustrated in FIG. 3 according to an exemplary embodiment of the present invention.

Referring to FIG. 4, the differential input section 310 includes two NMOS transistors 410 and 420, and a current source Iss.

A differential input signal Vin is supplied to a gate of two NMOS transistors 410 and 420. A differential current flows in each drain of the NMOS transistors 410 and 420 according to the differential input signal Vin. Namely, a voltage is applied to the gate of the NMOS transistors 410 and 420. According to variation of the applied voltage, a drain current of the NMOS transistors 410 and 420, i.e., a differential current, also varies.

The current source Iss functions to hold a bias point of the differential input section 310. The current source Iss may be embodied by using various methods. As an example, the current source Iss may be a current mirror. The current mirror utilizes a MOS transistor.

Referring again to FIG. 3, the active load 320 generates a differential output signal according to a differential current generated from the differential input section 310. Also, the active load 320 outputs the generated differential output signal via output nodes Nn and Np of the active load 320.

The active load 320 includes first and second active load sections, and a common mode feedback section.

The first and second active load sections respectively include a negative feedback loop connected to the output nodes Nn or Np of the active load 320. In this case, the negative feedback loop may include two pairs of two transistors. Also, the first and the second active load sections function as a load with respect to the differential current, to generate the differential output signal.

The common mode feedback section includes a feedback current source providing a feedback current. In this instance, the feedback current is supplied to the first and the second active load sections to form a common mode feedback path. In this case, the common mode feedback section may include feedback resistances.

The differential amplifier illustrated in FIG. 3 may control a common mode voltage by adjusting a feedback current. Accordingly, the operation voltage change of the differential amplifier according to process variation such as a transconductance of a transistor may be effectively compensated.

Figure 5:
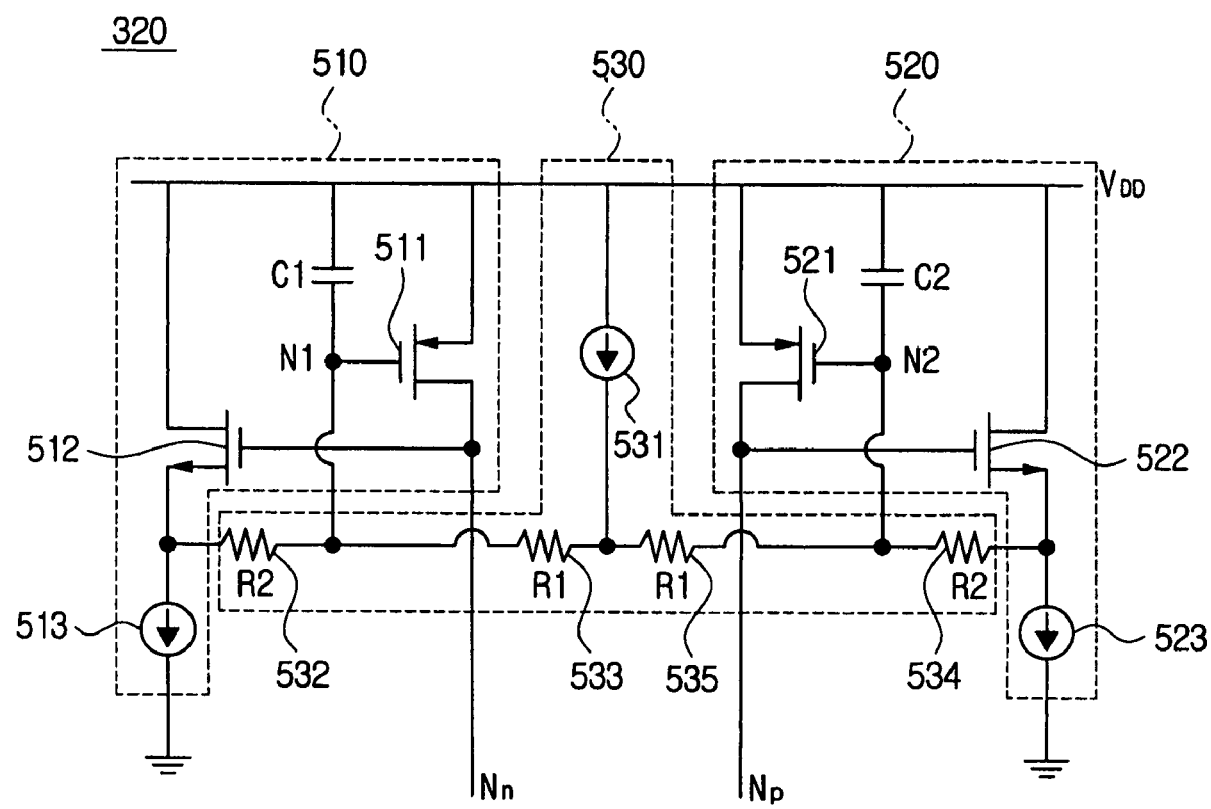
FIG. 5 is a circuit diagram of an active load illustrated in FIG. 3 according to an exemplary embodiment of the present invention.

FIG. 5 is a circuit diagram of the active load 320 illustrated in FIG. 3 according to an exemplary embodiment of the present invention.

Referring to FIG. 5, the active load 320 includes active load sections 510 and 520, and a common mode feedback section 530.

The active load sections 510 and 520 respectively include a negative feedback loop, and function as a load with respect to a differential current to generate a differential output signal. In this instance, the differential current is supplied by a differential input section.

Feedback returns part of the output back into the input. Also, feedback set up to reduce the change of output by negative feedback. The negative feedback improves the stability and linear characteristics of an amplifier and enhances the frequency characteristics. Also, the negative feedback increases input impedance and decreases output impedance. Accordingly, the negative feedback may be effectively utilized in an analog circuit.

The active load section 510 includes a PMOS transistor 511, an NMOS transistor 512, a load current source 513 and a capacitor C1.

A source of the PMOS transistor 511 is connected to a power supply voltage VDD and a gate thereof is connected to a node N1.

A drain of the NMOS transistor 512 is connected to the power supply voltage VDD and a gate thereof is connected to a drain of the PMOS transistor 511.

The load current source 513 is connected between a source of the NMOS transistor 512 and a ground potential.

The capacitor C1 is connected between the power supply voltage VDD and the node N1.

Hereinafter, a negative feedback path of the active load section 510 will be described. When a voltage of the node N1 decreases, a current flow in an output node Nn of the active load section 510 increases. This is because the voltage difference between the source and the gate of the PMOS transistor 511 increases. When a current flow in the output node Nn of the active load section 510 increases, the voltage difference between the source and the drain of the PMOS transistor 511 decreases. Accordingly, a voltage of the output node Nn of the active load section 510 increases. Also, when the voltage of the output node Nn of the active load section 510 increases, a voltage applied to the gate of the NMOS transistor 512 also increases. Accordingly, a current flow in the drain of the NMOS transistor 512 increases. When a current flow in the drain of the NMOS transistor 512 increases, the voltage difference between the source and the drain of the NMOS transistor 512 decreases. Accordingly, a voltage of a source terminal of the NMOS transistor 512 increases. Also, when the voltage of the source terminal of the NMOS transistor 512 increases, the voltage of the node N1 increases. Accordingly, a current flow in the output node Nn of the active load section 510 decreases.

The active load section 520 includes a PMOS transistor 521, an NMOS transistor 522, a load current source 523 and a capacitor C2.

A source of the PMOS transistor 521 is connected to the power supply voltage VDD and a gate thereof is connected to the node N2.

A drain of the NMOS transistor 522 is connected to the power supply voltage VDD and a gate thereof is connected to a drain of the PMOS transistor 521.

The load current source 523 is connected between a ground potential and a source of the NMOS transistor 522.

The capacitor C2 is connected between the power supply voltage VDD and the node N2.

Hereinafter, a negative feedback path of the active load section 520 will be described. When a voltage of the node N2 decreases, a current flow in an output node Np of the active load section 520 increases. This is because the voltage difference between the source and the gate of the PMOS transistor 521 increases. When a current flow in the output node Np of the active load section 520 increases, the voltage difference between the source and the drain of the PMOS transistor 521 decreases. Accordingly, a voltage of the output node Np of the active load section 520 increases. Also, when the voltage of the output node Np of the active load section 520 increases, a voltage applied to the gate of the NMOS transistor 522 also increases. Accordingly, a current flow in the drain of the NMOS transistor 522 increases. When a current flow in the drain of the NMOS transistor 522 increases, the voltage difference between the source and the drain of the NMOS transistor 522 decreases. Accordingly, a voltage of a source terminal of the NMOS transistor 522 increases. Also, when the voltage of the source terminal of the NMOS transistor 522 increases, the voltage of the node N2 increases. Accordingly, a current flow in the output node Np of the active load section 520 decreases.

As described above, the active load sections 510 and 520 include a negative feedback loop, which helps the circuit to operate stably and to have a wider bandwidth.

The capacitors C1 and C2 may be embodied by using various methods. As an example, the capacitors C1 and C2 may be metal insulator metal (MIM) capacitors or poly insulator poly (PIP) capacitors, or other capacitor types known in the art. Also, the capacitors C1 and C2 may be embodied by using a MOS transistor in which a drain and a source are connected.

In the embodiment illustrated in FIG. 5, the common mode feedback section 530 includes a feedback current source 531 and also feedback resistances 532, 533, 534 and 535.

In this case, the feedback resistance 532 may be substantially identical to the feedback resistance 534. Also, the feedback resistance 533 may be substantially identical to the feedback resistance 535.

The feedback resistance 532 is connected between the node N1 and the source of the NMOS transistor 512.

The feedback resistance 533 is connected between the node N1 and a first terminal of the feedback current source 531.

The feedback resistance 534 is connected between the node N2 and the source of the NMOS transistor 522.

The feedback resistance 535 is connected between the node N2 and the first terminal of the feedback current source 531.

A second terminal of the feedback current source 531 is connected to the power supply voltage VDD.

The feedback resistances 532, 533, 534 and 535 work to improve a gain of the differential amplifier and to increase the output voltage swing range. Also, the ratio of the feedback resistances 532, 533, 534 and 535 is a factor in determining a bandwidth. Accordingly, the change of the bandwidth according to process variation such as a transconductance of a transistor is reduced.

Figure 6:
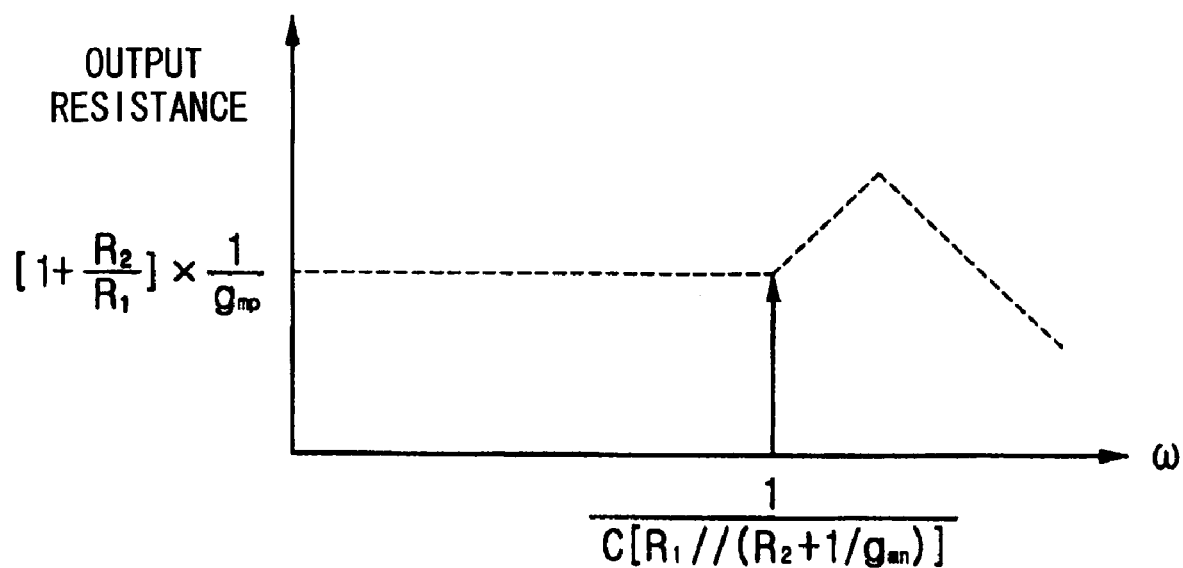
FIG. 6 is a graph illustrating the frequency characteristics of the active load illustrated in FIG. 5.

FIG. 6 is a graph illustrating the frequency characteristics of the active load illustrated in FIG. 5.

In FIG. 6, $R_1$ is the magnitude of the feedback resistances 533 and 535 of FIG. 5. $R_2$ is the magnitude of the feedback resistances 532 and 534 of FIG. 5. Also, $g_{mp}$ is a transconductance of the PMOS transistors 511 and 521 of FIG. 5 and $g_{mn}$ is a transconductance of the NMOS transistors 512 and 522 of FIG. 5.

FIG. 6 shows the change of output resistance of the active load illustrated in FIG. 5 according to frequency change. Generally, a gain of a differential amplifier is determined according to an output resistance. Accordingly, when the output resistance increases, the gain of the differential amplifier also increases. Also, when the output resistance decreases, the gain of the differential amplifier also decreases.

As shown in FIG. 6, the bandwidth and the output resistance, i.e., a gain of an active load, is determined by the feedback resistances. Accordingly, the change of a bandwidth and output resistance, i.e., gain, according to process variation such as a transconductance of a transistor, may be reduced.

Figure 7:
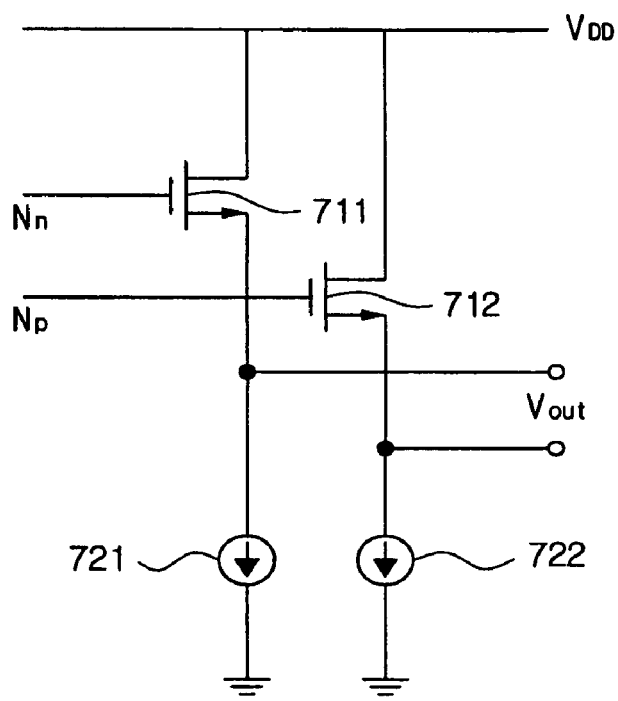
FIG. 7 is a circuit diagram of an output buffer illustrated in FIG. according to an exemplary embodiment of the present invention.

FIG. 7 is a circuit diagram of the output buffer 330 illustrated in FIG. 3 according to an exemplary embodiment of the present invention.

Referring to FIG. 7, the output buffer 330 includes source follower transistors 711 and 712, and current sources 721 and 722.

A source follower has high input resistance and low output resistance. Accordingly, the source follower is advantageously used for an output buffer or a level shifter.

The change of a voltage inputted via a gate of the source follower resistors 711 and 712 is outputted to an output end Vout with almost no change of the voltage. The output end Vout is a source of the source follower transistors 711 and 712,. Accordingly, an appropriately buffered output signal may be generated by using the source follower transistors 711 and 712.

Figure 8:
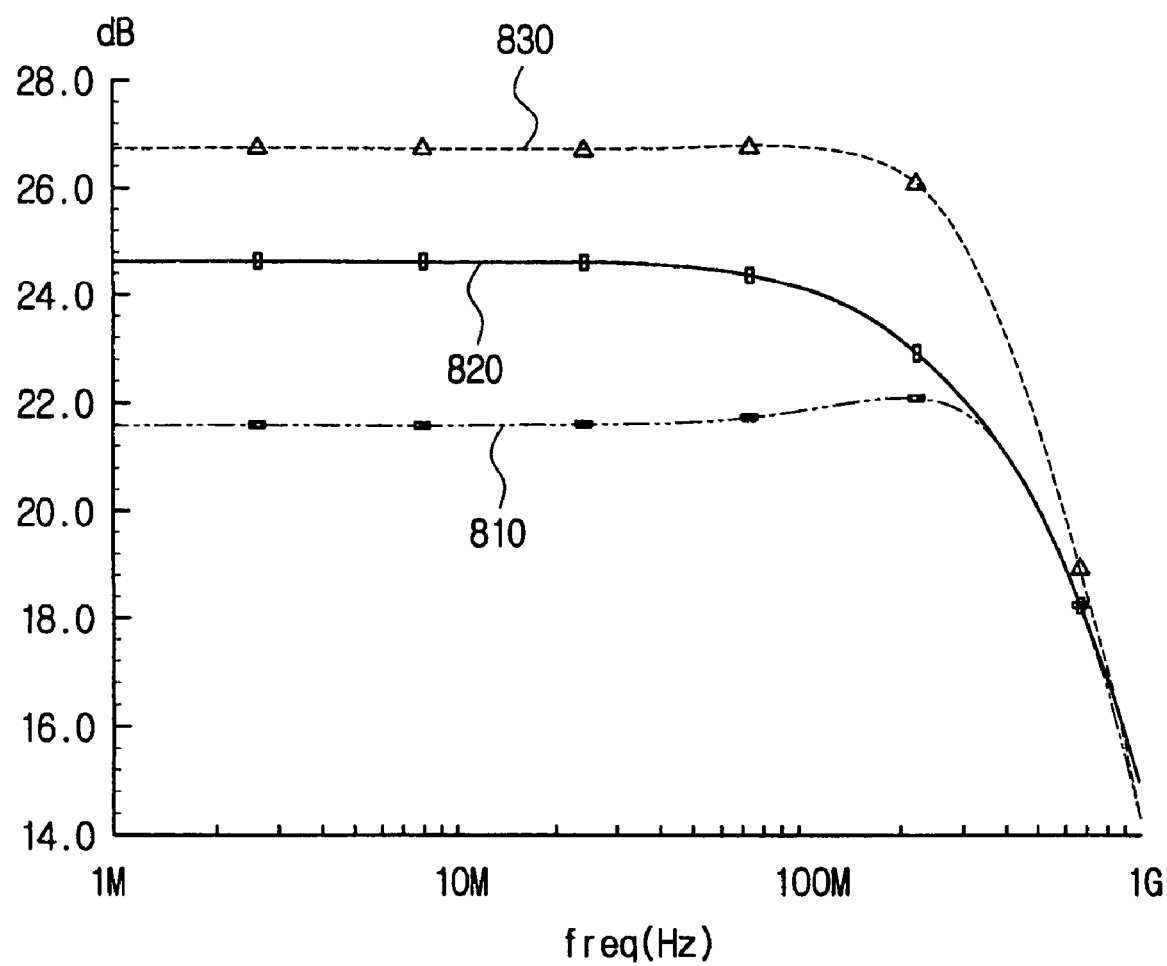
FIG. 8 is a graph illustrating a comparison between the frequency characteristics of the differential amplifier according to the conventional arts and the differential amplifier according to the present invention.

FIG. 8 is a graph illustrating a comparison of the frequency characteristics of the differential amplifier according to the conventional arts and the differential amplifier according to an exemplary embodiment of present invention.

FIG. 8 shows a gain change 830 according to the frequency change, in the case of an active load according to an exemplary embodiment of the present invention, and gain changes 810 and 820 according to the frequency change, in the case of an active load according to the conventional arts.

Figure 2:
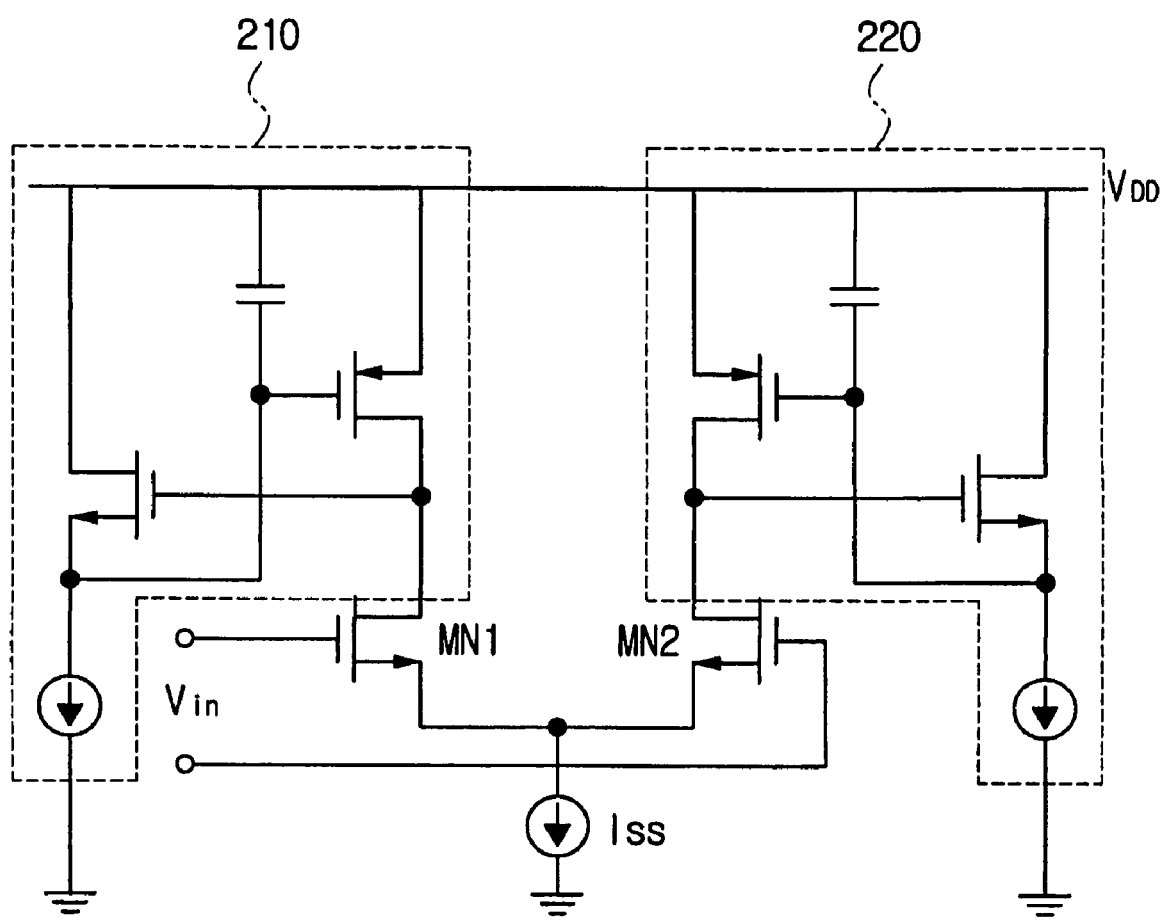
FIG. 2 is a circuit diagram of another differential amplifier according to the conventional art.

In FIG. 8, a curve of the gain change 810 shows how a gain changes according to the frequency change, in the case of using the active loads 210 and 220 according to the conventional art, as shown in FIG. 2. Also, a curve of the gain change 820 shows how a gain changes according to the frequency change, in the case of using the active load according to the conventional art, as shown in FIG. 1. Also, a curve of the gain change 830 shows how a gain changes according to the frequency change, in the case of using the active load 320 illustrated in FIG. 5.

As shown in FIG. 8, compared with the conventional arts, in the case of using the active load 320 according to an exemplary embodiment of the present invention as shown in FIG. 5, a gain and a bandwidth is improved.

In particular, in the case of using the active load 320 according to an exemplary embodiment of the present invention, as shown in FIG. 5, a gain is about 26.6 dB. In the case of using the active loads 210 and 220 illustrated in FIG. 2, a gain is about 22 dB. Accordingly, a gain is improved by about 25%.

As described above, the present invention has been described on the basis of exemplary embodiments of FIGS. 3 to 5 and FIG. 7. However, the technical spirit of the present invention is not limited thereto. Also, a differential input section and an output buffer of the present invention may be embodied by using various methods, not to mention the exemplary embodiments illustrated in FIGS. 4 and 7. As long as an active load having an active load section including a negative feedback loop and a common mode feedback section including a feedback current source is utilized, the exemplary embodiment of the differential input section and the output buffer is irrelevant and does not depart from the technical spirit of the present invention.

A differential amplifier and an active load according to exemplary embodiments of the present invention supply a feedback current to a negative feedback loop. Accordingly, the change of a common mode operating voltage according to process variation may be effectively compensated. Also, the common mode operating voltage of the differential amplifier may be easily set up.

Also, the present invention may provide a new differential amplifier which has an improved gain, frequency characteristic and stability and also has an increased swing width of an output end and linear operation area, and an active load for the differential amplifier.

Also, according to the present invention, resistance can be inserted into a negative feedback path. Accordingly, it is possible to reduce the change of a bandwidth or gain of an amplifier according to process variation with respect to the characteristic of a transistor such as transconductance or the like.

Also, according to the present invention, a wider bandwidth and a higher gain may be provided even with a low voltage. Accordingly, a differential amplifier of the present invention may be effectively applicable to an ultra wideband (UWB) application.

Although a few exemplary embodiments of the present invention have been shown and described, the present invention is not limited to the described exemplary embodiments. Instead, it would be understood by those skilled in the art that changes may be made to these exemplary embodiments without departing from the principles and spirit of the invention, the scope of which is defined by the claims and their equivalents.

What is claimed is:

1. A differential amplifier comprising:
   a differential input section which is configured to generate a differential current according to a differential input signal; and
   an active load which is configured to generate a differential output signal according to the differential current, wherein the active load comprises:
   first and second active load sections comprising a first negative feedback loop and a second negative feedback loop, respectively; and
   a common mode feedback section comprising a feedback current source which supplies a feedback current to the first active load section and the second active load section to form a common mode feedback path.

2. The differential amplifier of claim 1, wherein the first and second active load sections function as a load with respect to the differential current to generate the differential output signal.

3. The differential amplifier of claim 1, wherein the differential amplifier adjusts the feedback current to control a common mode voltage of the differential amplifier.

4. The differential amplifier of claim 1, wherein each of the first and the second negative feedback loops comprises an NMOS transistor and a PMOS transistor.

5. The differential amplifier of claim 1, wherein the first active load section comprises:
   a first PMOS transistor having a source coupled to a power supply voltage and a gate coupled to a first node;
   a first NMOS transistor having a drain coupled to the power supply voltage and a gate coupled to a drain of the first PMOS transistor;
   a first load current source coupled between a source of the first NMOS transistor and a ground potential; and
   a first capacitor coupled between the power supply voltage and the first node.

6. The differential amplifier of claim 5, wherein the second active load section comprises:
   a second PMOS transistor having a source coupled to the power supply voltage and a gate coupled to a second node;
   a second NMOS transistor having a drain coupled to the power supply voltage and a gate coupled to a drain of the second PMOS transistor;
   a second load current source coupled between a source of the second NMOS transistor and the ground potential; and
   a second capacitor coupled between the power supply voltage and the second node.

7. The differential amplifier of claim 6, wherein the common mode feedback section further comprises:

a first feedback resistance coupled between the source of the first NMOS transistor and the first node;
a second feedback resistance coupled between the first node and a first terminal of the feedback current source;
a third feedback resistance coupled between the source of the second NMOS transistor and the second node; and
a fourth feedback resistance coupled between the second node and the first terminal of the feedback current source, and
a second terminal of the feedback current source coupled to the power supply voltage.

8. The differential amplifier of claim 7, wherein the first feedback resistance is equal to the third feedback resistance, and the second feedback resistance is equal to the fourth feedback resistance.

9. The differential amplifier of claim 1, further comprising an output buffer which is configured to buffer the differential output signal.

10. The differential amplifier of claim 9, wherein the output buffer comprises a source follower circuit.

11. An active load comprising:
a first active load section and a second active load section comprising a first negative feedback loop and a second negative feedback loop, respectively; and
a common mode feedback section comprising a feedback current source which supplies a feedback current to the first active load section and the second active load section, and forms a common mode feedback path.

12. The active load of claim 11, wherein the active load adjusts the feedback current to control a common mode voltage of an output node of the first active load section and the second active load section.

13. The active load of claim 11, wherein each of the first negative feedback loop and the second negative feedback loop comprises an NMOS transistor and a PMOS transistor.

14. The active load of claim 11, wherein the first active load section comprises:
a first PMOS transistor having a source coupled to a power supply voltage and a gate coupled to a first node;
a first NMOS transistor having a drain coupled to the power supply voltage and a gate coupled to a drain of the first PMOS transistor;
a first load current source coupled between a source of the first NMOS transistor and a ground potential; and
a first capacitor coupled between the power supply voltage and the first node.

15. The active load of claim 14, wherein the second active load section comprises:
a second PMOS transistor having a source coupled to the power supply voltage and a gate coupled to a second node;
a second NMOS transistor having a drain coupled to the power supply voltage and a gate coupled to a drain of the second PMOS transistor;
a second load current source coupled between a source of the second NMOS transistor and the ground potential; and
a second capacitor coupled between the power supply voltage and the second node.

16. The active load of claim 15, wherein the common mode feedback section further comprises:
a first feedback resistance coupled between the source of the first NMOS transistor and the first node;
a second feedback resistance coupled between the first node and a first terminal of the feedback current source;
a third feedback resistance coupled between the source of the second NMOS transistor and the second node; and
a fourth feedback resistance coupled between the second node and the first terminal of the feedback current source, and
a second terminal of the feedback current source coupled to the power supply voltage.

17. The active load of claim 16, wherein the first feedback resistance is equal to the third feedback resistance, and the second feedback resistance is equal to the fourth feedback resistance.

* * * * *